United States Patent [19]
Yoshida

[11] Patent Number: 4,782,247
[45] Date of Patent: Nov. 1, 1988

[54] DECODER CIRCUIT HAVING A VARIABLE POWER SUPPLY

[75] Inventor: Masanobu Yoshida, Kawaguchi, Japan

[73] Assignee: Fujitsu Limited, Kanagawa, Japan

[21] Appl. No.: 759,980

[22] Filed: Jul. 29, 1985

[30] Foreign Application Priority Data

Aug. 8, 1984 [JP] Japan .................. 59-166114
Aug. 31, 1984 [JP] Japan .................. 59-182417

[51] Int. Cl.$^4$ .................. G11C 80/00; G11C 11/34; H03K 19/017
[52] U.S. Cl. .................. 307/449; 307/450; 307/451; 307/463; 365/184
[58] Field of Search .................. 365/226, 104, 184; 307/448–451, 463

[56] References Cited

U.S. PATENT DOCUMENTS

| | | | |
|---|---|---|---|
| 3,982,138 | 9/1976 | Luisi et al. | 307/450 |
| 3,995,171 | 11/1976 | Sonoda | 307/449 |
| 4,374,430 | 2/1983 | Higuchi | 307/449 |
| 4,415,993 | 11/1983 | Smith et al. | 365/184 |
| 4,443,718 | 4/1984 | Hagiwara et al. | 365/184 |

FOREIGN PATENT DOCUMENTS

| | | |
|---|---|---|
| 0060078 | 3/1981 | European Pat. Off. . |
| 0029715 | 6/1981 | European Pat. Off. . |
| 59-127294 | 12/1982 | Japan . |
| 2904086 | 2/1982 | United Kingdom . |

OTHER PUBLICATIONS

8107 IEEE Journal of Solid-State Circuits, vol. SC-18(1983), Oct., No. 5, New York, USA "A High-Speed Ultra-Low Power 64K CMOS EPROM with On-Chip Test Functions". pp. 554–561.

Primary Examiner—John S. Heyman
Assistant Examiner—M. R. Wambach
Attorney, Agent, or Firm—Armstrong, Nikaido, Marmelstein & Kubovcik

[57] ABSTRACT

A decoder circuit fabricated in an IC memory chip and provided to respective word-lines and respective bit-lines of an IC memory matrix fabricated in the IC memory chip, is provided for selecting an EPROM cell which is placed on an intersection point of the word-line and the bit-line, to program a datum into the EPROM cell by using a high power supply voltage when the decoder circuit operates under a programming mode and to read out a datum stored in the EPROM cell by using a low power supply voltage when the decoder circuit operates under a reading mode, receiving an address signal from the exterior of the decoder circuit. The decoder circuit comprises a NAND gate having its load and a CMOS invertor. In making the load of the NAND gate function as a constant current load, only a variable power supply voltage, which becomes a high and a low voltage according to the programming and the reading mode respectively, can be applied to the decoder circuit without using other elements such as a transfer gate and a compensator as required in the prior art.

3 Claims, 2 Drawing Sheets

DECODER CIRCUIT HAVING A VARIABLE POWER SUPPLY

BACKGROUND OF THE INVENTION

The present invention relates to a decoder circuit used in an integrated semiconductor circuit (IC) memory chip or die which comprises a memory cell matrix consisting of a plurality of memory cells. More particularly, the present invention relates to a decoder circuit adapted for a respective memory cell which requires two kinds of power supply voltages for programming and reading the data into and from the memory cell respectively. A specific example of this type of memory cell is an erasable programmable read only memory (EPROM) cell.

The memory cell matrix is composed of a plurality of word-lines and bit-lines, and an EPROM cell is placed at each intersection point of respective word-lines and bit-lines. The EPROM cell requires two kinds of power supply voltages—a high power supply voltage and a low power supply voltage—for programming and reading out the data into and from the cell respectively; the high and the low power supply voltages are supplied to the IC memory chip from its exterior. There is no difference among the decoder circuits, but there are two groups of the decoder circuits: the one group consists of row decoder circuits each provided for respective word-line, and the other group consists of column decoder circuits each provider for respective bit-lines. A designated EPROM cell transistor is selected by external address signals given from a computer system to which the IC memory chip belongs; the selection is done by applying row and column address signals to the row and the column decoder circuits respectively. For example, when the row address signals are applied to the row decoder circuits, one of the row decoder circuits outputs an H level. As a result, only one work-line is raised up to the H level so that the EPROM cell transistors, in which the gates are connected to the word-line, are ready to read out the data. The same process is also enforced to the bit-line through the column decoder circuit, so that a designated EPROM cell transistor can be selected so as to be ready to read out the data. In this case, it is said that the row and column decoder circuits are in a selective state and other decoder circuits are in a non-selective state hereinafter.

Thus, the total number of the decoder circuits fabricated in the IC memory chip are as many as the total number of the word-lines and the bit-lines. The row decoder circuit and the column decoder circuit are similar to each other, so the row decoder circuit will be discussed below.

FIG. 2 is a conventional row decoder circuit of the prior art, and it shows a case in which the row decoder circuit receives a unique combination of address signals composed of 3 bits, $a_0/\bar{a}_0 \sim a_2/\bar{a}_2 : a_i/\bar{a}_i$ means $a_i$ or $\bar{a}_i$, and $\bar{a}_i$ means an inverted signal of $a_i$ such that when $a_i$ is a signal having a high level, $\bar{a}_i$ is a signal having a low level. These internal address signals are generated inside the semiconductor chip in response to the external address signals applied to the chip from the exterior. So, the row decoder circuit of FIG. 2 is one of eight row decoder circuits, and a word-line WL is one of eight word-lines.

In FIG. 2, all MOS transistors used in the circuit are enhancement (E) type, and $Q_{n1} \sim Q_{n5}$ are n channel MOS transistors and $Q_{p1} \sim Q_{p3}$ are p channel MOS transistors. Two kinds of voltage sources—$V_{cc}$ and $V_{ppi}$—are applied to the circuit: $V_{cc}$ is a fixed low power supply voltage (5 volts (V) for example) and $V_{ppi}$ is a variable power supply voltage. The variable power supply voltage $V_{ppi}$ is changed so as to be a high power supply voltage $V_{pp}$ (12.5 V or 21 V for example) when a datum is programmed into an EPROM, and the low power supply voltage $V_{cc}$ when a datum is read out from an EPROM. Symbol $V_{ss}$ means the earth potential.

Transistors $Q_{n1} \sim Q_{n3}$ and $Q_{p1}$ compose a NAND gate and receive 3 address inputs at the same time. The output level of the NAND gate at output node X becomes low (L) when all of the 3 address inputs are in a high (H) level; and the decoder circuit is in the selective state. The output level at output node X becomes H when at least one of the 3 address inputs is in the L level; and the decoder circuit is in the non-selective state. The output of the NAND gate at node X is fed to the gates of transistors $Q_{p3}$ and $Q_{n5}$, which compose a CMOS inverter, through a transfer gate $Q_{n4}$. The CMOS inverter operates as follows: when the output level of the NAND gate at node X become L, transistors $Q_{n5}$ and $Q_{p3}$ turn OFF and ON respectively so that an H level (equal to the level of $V_{ppi}$) is outputted to word-line WL, and when the level at node X become H, transistors $Q_{n5}$ and $Q_{p3}$ turn ON and OFF respectively so that an L level is outputted to word-line WL. Thus, when the row decoder circuit is in the selective state, the level on word-line WL becomes H so that an EPROM cell transistor having its gate connected to the word-line, becomes able to read out the datum or program the datum.

Transistor $Q_{p2}$ is a pull-up transistor used as a level compensator. When the IC memory chip is in a programming mode which is a mode to program a datum into the EPROM, variable power supply voltage $V_{ppi}$ is switched to high power supply voltage $V_{pp}$. However, when the level at node X of the NAND gate is H and if there were no transistor $Q_{p2}$ in the decoder circuit, an input signal (level) of inverter $Q_{p3}-Q_{n5}$ could not reach an voltage level higher than power supply voltage $V_{cc}$. This is due to a fact that the NAND gate always uses low power supply voltage $V_{cc}$ as the power supply voltage. If so, the inverter $Q_{p3}-Q_{n5}$ would become unstable; the inverter could not produce a stable L level. In addition, a large DC current would flow constantly through transistors $Q_{p3}$ and $Q_{n5}$ from the power supply to the earth since both the transistors would be ON under this condition, resulting in large power consumption. This can be compensated by transistor $Q_{p2}$; when the level on the word-line WL becomes L, the level L is fed back to transistor $Q_{p2}$ turning it ON, so high power supply voltage $V_{pp}$ is applied to the gates of the inverter $Q_{p3}-Q_{n5}$ so that transistor $Q_{p3}$ completely cuts off; then the level on the word-line WL can be fixed to L so that word-line WL completely becomes a non-selected state.

At this moment, the level at node X and the level at the gates of the inverter $Q_{p3}-Q_{n5}$ become almost equal to low power supply voltage $V_{cc}$ and high power supply voltage $V_{pp}$ respectively. The transfer gate of transistor $Q_{n4}$ is to prevent the competition of the $V_{cc}$ and $V_{pp}$; when transistor $Q_{p2}$ pulls up the voltage on the gates of the inverter $Q_{p3}-Q_{n5}$ to high power supply voltage $V_{pp}$, transistor $Q_{n4}$ is driven to be cut off.

When the level at node X is L in the programming mode, which means that the decoder circuit is in the selective state, the level appearing on word-line WL becomes H, so transistor $Q_{p3}$ turns OFF; then transistor $Q_{p3}$ of the inverter turns ON so that the level on word-line WL completely becomes H as high as power supply voltage $V_{pp}$.

When the row decoder circuit is in a reading mode which is a mode to read out data stored in the EPROM, variable power supply voltage $V_{ppi}$ switches to low power supply voltage $V_{cc}$ and the compensator and the transfer gate functions similarly to the above in the programming mode.

As explained above, the transistors of the compensator and the transfer gate are necessary for maintaining each level of the word-line and the bit-line so as to avoid a large constant current at the CMOS inverter and obtain a stable low level output in respective rows and columns of the decoder circuit. Thus, there are many IC elements like transistors and wirings in each decoder circuit, and as many decoder circuits are required as the number of the row and bit lines in the IC memory chip. So, even though the memory matrix consisting of the EPROMs can be integrated in a high packing density within the skill of the art, the area for the decoder circuits becomes dominant in a space factor and increases difficulty of fabricating a small IC memory chip. Especially, the area becomes a big problem for compactly designing a high density IC memory chip having memory capacity such as 256 kilo-bits (K-bits) or more.

SUMMARY OF THE INVENTION

An object of the present invention is to reduce the IC elements of the decoder circuit which is fabricated with respective word-lines and bit-lines of a memory matrix in an IC memory chip.

Another object of the present invention is to simplify the power supply voltage applied to the decoder circuits so that only one kind of power supply voltage is enough to operate the decoder circuits.

Still another object of the present invention is to reduce the DC current dissipated in the decoder circuits.

Furthermore another object of the present invention is to reduce the fabricating cost of the decoder circuits.

A further object of the present invention is to realize a high packing density of the IC memory chip, to decrease the DC current dissipated in the IC memory chip, and to reduce the fabricating cost of the IC memory chip.

The above objects of the present invention are achieved by simplifying the ordinary decoder circuit so as to be composed of only a decoding logic gate, particularly a NAND gate and a CMOS invertor by removing a compensator and a transfer gate from the ordinary decoder circuit. The simplification is made by applying a depletion type transistor to the load of the NAND gate and making the depletion type transistor operate as a constant current load. By doing so, the same variable power supply voltage can be applied to the NAND gate and the inverter, so that the NAND gate output can directly drive the inverter. This means that the compensator, a lead which has been necessary to feed the output of the inverter back to the compensator, and the transfer gate are not necessary any more to the decoder circuit.

DETAILED DESCRIPTION OF THE INVENTION

Figure 1:
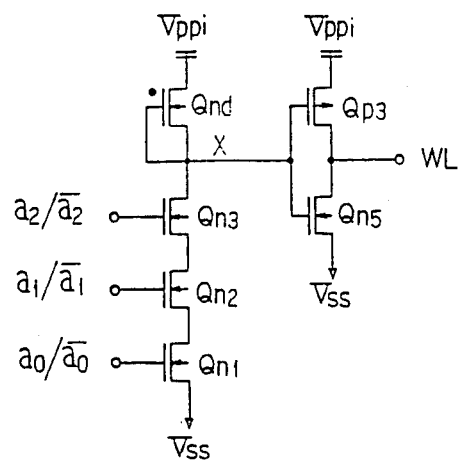
FIG. 1 is a circuit diagram of a decoder circuit embodying the present invention.
Figure 2:
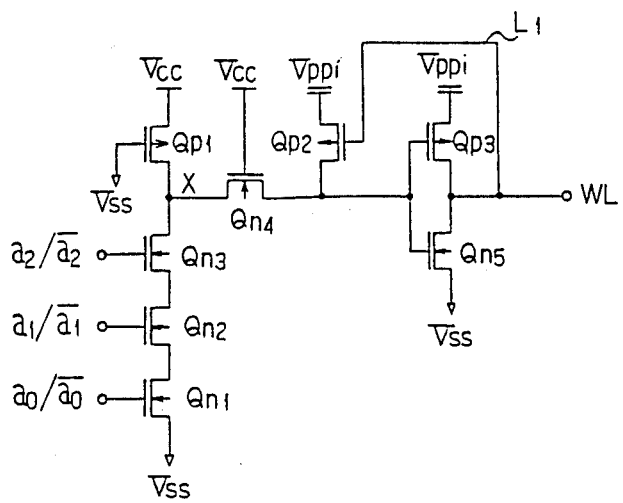
FIG. 2 is a circuit diagram of a decoder circuit of the prior art.

FIG. 1 is a circuit diagram of a decoder circuit embodying the present invention. In FIG. 1, the same reference symbols as in FIG. 2 designate the same parts as in FIG. 2. The different points of FIG. 1 from FIG. 2 are as follows: firstly, replacing transistor $Q_{p1}$, which has been the E type p channel MOS transistor used as a load of the NAND gate in the ordinary decoder circuit in FIG. 2, with a depletion (D) type n channel metal insulated semiconductor (MIS) transistor $Q_{nd}$; secondly, applying variable power supply voltage $V_{ppi}$ to the NAND gate instead of fixed low power supply voltage $V_{cc}$; and thirdly, the CMOS inverter $Q_{p3}$–$Q_{n5}$ being directly driven by the NAND gate output which appears at node X instead of feeding through the transfer gate (transistor $Q_{n4}$) in FIG. 2. Therefore, the compensator (transistor $Q_{p2}$), the transfer gate (transistor $Q_{n4}$), and feed back lead $L_1$ can be removed from the prior art decoder circuit shown in FIG. 2. Furthermore, in the invented decoder circuit in FIG. 1, only one n well is enough to be fabricated for a p channel transistor (transistor $Q_{p3}$), but in FIG. 2, two n wells have been necessary to be fabricated. An ion implantation process is required for fabricating the channel of the D type transistor $Q_{nd}$ to realize the invented decoder circuit; however, the advantage that the invented decoder circuit can be fabricated in a high packing density is far superior than the disadvantage that the invented decoder circuit requires the ion implantation process in the fabrication.

In FIG. 1, as the load of the NAND gate, transistor $Q_{nd}$, is a D type n channel MIS transistor and its gate and source are connected in common, the internal resistance of transistor $Q_{nd}$ changes so as to become large when the applied variable power supply voltage $V_{ppi}$ switches to power supply voltage $V_{pp}$ and to become small when applied variable power supply voltage $V_{ppi}$ switches to low power supply voltage $V_{cc}$. In other words, transistor $Q_{nd}$ functions as a constant current load. The operation of the decoder circuit, which has the constant current load in the NAND gate, will be set forth when the decoder circuit operates in the selective or non-selective state under the programming or reading mode.

When all of address signal inputs are at H level, the output of the NAND gate at node X becomes an L level; the decoder circuit goes into the selective state. In this case, either the decoder circuit operates under the programming mode or the reading mode, the output L level is always driven to earth potential $V_{ss}$ and directly fed to the gates of the inverter $Q_{p3}$–$Q_{n5}$; transistor $Q_{nd}$ is the depletion type and causes the constant current as mentioned above, so the output L level can be driven to earth potential $V_{ss}$ by designing the ratio of the conductance between the NAND gate load (transistor $Q_{nd}$) and the NAND gate elements (transistors $Q_{n1}$, $Q_{n2}$, and $Q_{n3}$). Therefore, inverter $Q_{p3}$–$Q_{n5}$ can stably produce an H level on the word-line WL.

When at least one of the address signal inputs is an L level, the output of the NAND gate at node X becomes an H level; the decoder circuit causes the non-selective state. In this case, when the decoder circuit operates under the programming mode or reading mode, variable power supply voltage $V_{ppi}$ becomes $V_{pp}$ or $V_{cc}$ respectively, then the output H level becomes $V_{pp}$ or $V_{cc}$ and directly drives inverter $Q_{p3}$–$Q_{n5}$. Under this condition, transistor $Q_{p3}$ completely cuts off and no constant DC current flows through the inverter. Therefore, the problem of large power consumption can be avoided and the inverter can stably produce an L level on word-line WL. The output CMOS inverter also provides a sufficiently large driving capability.

Thus, the decoder circuit of FIG. 1 stably operates without the compensator, the associated feed back lead, and the transfer gate. As the decoder circuit is attached to each word-line and bit-line, the removal of such elements brings a great effect for realizing the high packing density of the IC memory chip, especially of the chip having a large memory capacitor such as 256 K-bits or 512 K-bits. In the IC memory chip, a size of the decoder circuit decides the interval space between the word-lines or the bit-lines, in other words, the interval space is a large factor in deciding the size of the IC memory chip. Therefore, realizing the high packing density of the decoder circuit is very effective for increasing that of the IC memory chip. Applying the decoder circuit shown in FIG. 1, the following result of the interval space is obtained by experiment: the interval space of the prior art was 48 micro-meter; however, the interval space has been reduced by half, 24 micrometer, by applying the decoder circuit of FIG. 1 to the IC memory chip.

A U.S. Pat. No. 4,374,430 is a patent which relates also to the decoder circuit used in an IC memory chip comprising EPROMs. However, the patent addresses the reduction of the DC current, which is spent in the IC memory chip, rather than increasing the packing density. Compared to the above patent, the present invention is for realizing the high packing density, which is also effective to reduce the DC current.

As mentioned above, high power supply voltage $V_{pp}$ and low power supply voltage $V_{cc}$ are supplied form the exterior of the IC memory chip. Generally, in the programming mode, the IC memory chip is put into a "programmer" for programming and high power supply voltage $V_{pp}$ is applied to the IC memory from its exterior, and after that, the IC memory chip is mounted in a printed circuit board and low power supply voltage $V_{cc}$ is applied from the exterior, the printed circuit board being, in the reading mode. Therefore, the shape, the size, and the number and the positions of the terminals of the IC memory chip are desired to meet with a technical standard such as the standard of the Joint Electron Device Engineering Council (JEDEC).

Figure 4:
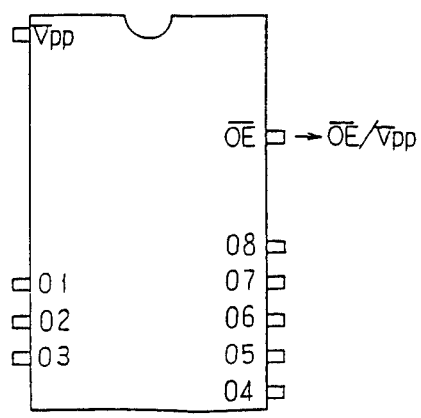
FIG. 4 is an illustrating diagram of a typical arrangement of external terminals of an IC memory chip.

From the above, reduction of the terminals is very important for the actual design of the IC memory chip, though the reduction is achieved by only one terminal; FIG. 4 shows this case. FIG. 4 is an example of the terminal positions of the IC memory chip: the figure only shows typical terminals relating to the following explanation. Symbol $\overline{OE}$ is an output enable terminal to which a control signal of a TTL (transistor transistor logic) level comes in when the chip is in the reading mode; when the control signal is an H level, output terminals O1~O8 become invalid (floating state) respectively, and when the control signal is an L level, the terminals become valid. In the programming mode, 21 V or 12.5 V is applied to the $V_{pp}$ terminal. In FIG. 4, if terminal $\overline{OE}$ is used for both, the $\overline{OE}$ signal and high power supply voltage $V_{pp}$, terminal $V_{pp}$ can be used for another signal, an address signal for example. In this case, the IC memory chip has to provide an $\overline{OE}/V_{pp}$ switching circuit.

Figure 3:
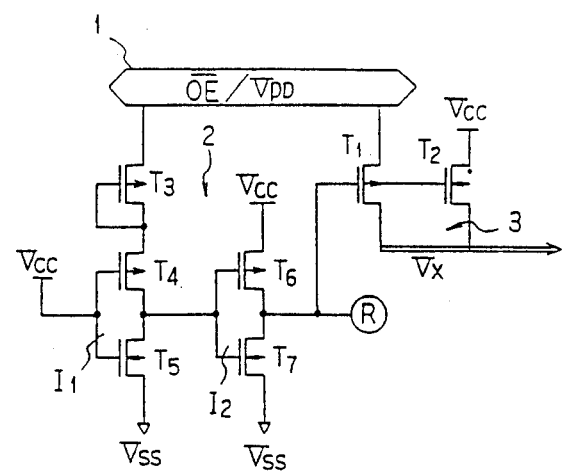
FIG. 3 is a circuit diagram of a switching circuit of a power supply voltage applied to the decoder circuit embodying the present invention.

FIG. 3 shows an example of the $\overline{OE}/V_{pp}$ switching circuit. In the figure, reference symbols $T_1$, $T_3$, $T_4$, and $T_6$ are the E type p channel MOS transistors, $T_5$ and $T_7$ are the E type n channel MOS transistors, and $T_2$ is a D type n channel MOS transistor whose threshold voltage is set to a proper voltage from a range of 0 V ~ low power supply voltage $V_{cc}$. Transistors $T_4$ and $T_5$ compose a CMOS inverter $I_1$ and transistors $T_6$ and $T_7$ compose a CMOS inverter $I_2$. Transistor $T_3$ operates as a level shifter so that it becomes ON only when its power supply voltage becomes more than 10 V. Transistor $T_3$ and invertors $I_1$ and $I_2$ compose a voltage detecting circuit 2, and transistors $T_1$ and $T_2$ compose a voltage selecting circuit 3.

When the IC memory chip is in the reading mode, output enable signal $\overline{OE}$, which is in the TTL level always less than 10 V, is applied to a terminal 1. So, transistor $T_3$ turns OFF, so that the output R of inverter $I_2$ becomes an H level which is equal to low power supply voltage $V_{cc}$. Then only transistor $T_2$ of the voltage selecting circuit 3 turns ON. Therefore, an output voltage $V_x$ of the $\overline{OE}/V_{pp}$ switching circuit produces low power supply voltage $V_{cc}$.

When the IC memory chip is in the programming mode, high power supply voltage $V_{pp}$ is applied to terminal 1. As the high power supply voltage $V_{pp}$ is more than 10 V, transistor $T_3$ turns ON, so that output R falls down to an L level. Then, transistors $T_1$ and $T_2$ become ON and OFF respectively, so that output $V_x$ turns high power supply voltage $V_{pp}$.

Therefore, applying the $\overline{OE}/V_{pp}$ switching circuit of FIG. 3 to the IC memory chip and changing terminal $\overline{OE}$ in FIG. 4 to terminal 1 of FIG. 3, terminal $V_{pp}$ in FIG. 4 can be used for another signal, which means one terminal can be reduced from the IC memory device.

What is claimed is:

1. A decoder circuit connected to a variable power supply source to receive a variable power supply voltage having one of first and second power supply voltage levels selectively, for decoding address signals and providing a selection signal of said first or second power supply voltage level respectively, said decoder circuit comprising:

a decoding logic gate, for decoding the address signals supplied to said decoding logic gate and having an output to provide a decoded signal, said decoding logic gate having a constant current load with comprises a depletion transistor having a gate, a source connected to said gate, and providing an output therefrom, and a drain connected to said variable power supply source;

said decoding logic gate further including a plurality of input transistors, connected in series to said constant current load for receiving said address signals, such that said series connected input transistors form a NAND gate; and an output circuit, connected to said variable power supply source and to said output of said decoding logic gate for receiving said decoded signal, and for providing said selection signal in response to said decoded signal.

2. A decoder circuit according to claim 1, wherein said output circuit comprises an inverter.

3. A decoder circuit according to claim 2, wherein said inverter is a CMOS (Complimentary Metal Oxide Semiconductor) inverter comprising a p channel type transistor and an n channel type transistor connected in series such that the source of the p channel type transistor is connected to the drain of said n channel type transistor for providing an output of said selection signal therefrom, and wherein the drain of the p channel type transistor is connected to said variable power supply voltage and the source of the n channel type transistor is connected to earth potential, each of said p channel and n channel type transistors having a commonly connected gate which is connected to the output of said decoding logic gate to receive said decoded signal.

* * * * *

UNITED STATES PATENT AND TRADEMARK OFFICE
CERTIFICATE OF CORRECTION

PATENT NO. : 4,782,247

DATED : November 1, 1988

INVENTOR(S) : Masanobu YOSHIDA

It is certified that error appears in the above-identified patent and that said Letters Patent is hereby corrected as shown below:

On the cover page, Item [54], the title should read

--DECODER CIRCUIT IN AN IC MEMORY CHIP HAVING A VARIABLE POWER SUPPLY--.

Column 1, lines 2 and 3, the title should read

--DECODER CIRCUIT IN AN IC MEMORY CHIP HAVING A VARIABLE POWER SUPPLY--.

Signed and Sealed this

Seventeenth Day of October, 1989

Attest:

DONALD J. QUIGG

Attesting Officer

Commissioner of Patents and Trademarks